United States Patent
Camacho et al.

(10) Patent No.: US 9,525,080 B2
(45) Date of Patent: Dec. 20, 2016

(54) SEMICONDUCTOR DEVICE WITH OPTICAL SENSOR AND METHOD OF FORMING INTERCONNECT STRUCTURE ON FRONT AND BACKSIDE OF THE DEVICE

(75) Inventors: Zigmund R. Camacho, Singapore (SG); Henry D. Bathan, Singapore (SG); Lionel Chien Hui Tay, Singapore (SG); Arnel Senosa Trasporto, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 137 days.

(21) Appl. No.: 13/555,353

(22) Filed: Jul. 23, 2012

(65) Prior Publication Data

US 2012/0286400 A1    Nov. 15, 2012

Related U.S. Application Data

(60) Continuation of application No. 12/941,683, filed on Nov. 8, 2010, now Pat. No. 8,866,248, which is a (Continued)

(51) Int. Cl.
*H01L 31/0203* (2014.01)
*H01L 21/683* (2006.01)
(Continued)

(52) U.S. Cl.
CPC ....... *H01L 31/0203* (2013.01); *H01L 21/6835* (2013.01); *H01L 24/19* (2013.01);
(Continued)

(58) Field of Classification Search
CPC ...... H01L 31/0203; H01L 24/19; H01L 24/96; H01L 27/14618; H01L 21/6835; H01L 24/82
See application file for complete search history.

(56) References Cited

U.S. PATENT DOCUMENTS

| 4,384,899 A | 5/1983 | Myers |
| 6,342,406 B1 | 1/2002 | Glenn et al. |

(Continued)

FOREIGN PATENT DOCUMENTS

| JP | 2005209689 A | 8/2005 |
| TW | M243785 U | 9/2004 |

*Primary Examiner* — John P Dulka
(74) *Attorney, Agent, or Firm* — Robert D. Atkins; Patent Law Group: Atkins and Associates, P.C.

(57) ABSTRACT

A semiconductor device includes a carrier and semiconductor die having an optically active region. The semiconductor die is mounted to the carrier to form a separation between the carrier and the semiconductor die. The semiconductor device further includes a passivation layer disposed over a surface of the semiconductor die and a glass layer disposed over a surface of the passivation layer. The passivation layer has a clear portion for passage of light to the optically active region of the semiconductor die. The semiconductor device further includes an encapsulant disposed over the carrier within the separation to form an expansion region around a periphery of the semiconductor die, a first via penetrating the expansion region, glass layer, and passivation layer, a second via penetrating the glass layer and passivation layer to expose a contact pad on the semiconductor die, and a conductive material filling the first and second vias.

25 Claims, 16 Drawing Sheets

Related U.S. Application Data division of application No. 11/965,160, filed on Dec. 27, 2007, now Pat. No. 7,851,246.

(51) Int. Cl.
*H01L 27/146* (2006.01)
*H01L 21/56* (2006.01)
*H01L 23/00* (2006.01)
*H01L 31/0232* (2014.01)

(52) U.S. Cl.
CPC .............. *H01L 24/82* (2013.01); *H01L 24/96* (2013.01); *H01L 27/14618* (2013.01); *H01L 21/565* (2013.01); *H01L 21/568* (2013.01); *H01L 24/05* (2013.01); *H01L 24/14* (2013.01); *H01L 24/17* (2013.01); *H01L 27/14625* (2013.01); *H01L 31/0232* (2013.01); *H01L 2224/0401* (2013.01); *H01L 2224/04105* (2013.01); *H01L 2224/12105* (2013.01); *H01L 2224/16225* (2013.01); *H01L 2224/82039* (2013.01); *H01L 2924/014* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01061* (2013.01); *H01L 2924/01078* (2013.01); *H01L 2924/01079* (2013.01); *H01L 2924/01082* (2013.01); *H01L 2924/10329* (2013.01); *H01L 2924/12042* (2013.01); *H01L 2924/14* (2013.01); *H01L 2924/15311* (2013.01); *H01L 2924/15331* (2013.01); *H01L 2924/181* (2013.01); *H01L 2924/19041* (2013.01); *H01L 2924/19042* (2013.01); *H01L 2924/19043* (2013.01); *H01L 2924/30105* (2013.01)

(56) References Cited

U.S. PATENT DOCUMENTS

| | | |
|---|---|---|
| 6,528,857 B1 | 3/2003 | Glenn et al. |
| 6,571,466 B1 | 6/2003 | Glenn et al. |
| 6,885,107 B2 | 4/2005 | Kinsman |
| 7,115,961 B2 | 10/2006 | Watkins et al. |
| 7,173,231 B2 | 2/2007 | Chen |
| 7,723,828 B2 | 5/2010 | Takeuchi et al. |
| 2003/0003225 A1 | 1/2003 | Choi et al. |
| 2003/0015342 A1* | 1/2003 | Sakamoto et al. ............ 174/250 |
| 2005/0184219 A1 | 8/2005 | Kirby |
| 2006/0170086 A1 | 8/2006 | Song et al. |
| 2006/0170110 A1* | 8/2006 | Akram et al. ................ 257/774 |
| 2006/0231750 A1 | 10/2006 | Chao et al. |
| 2006/0261340 A1 | 11/2006 | Farnworth et al. |
| 2009/0194516 A1* | 8/2009 | Deshi ....................... 219/121.71 |
| 2010/0267202 A1 | 10/2010 | Huang et al. |
| 2012/0286422 A1* | 11/2012 | Shim, II ................ H01L 21/568 257/737 |
| 2014/0217587 A1* | 8/2014 | Chen et al. ................... 257/738 |

\* cited by examiner

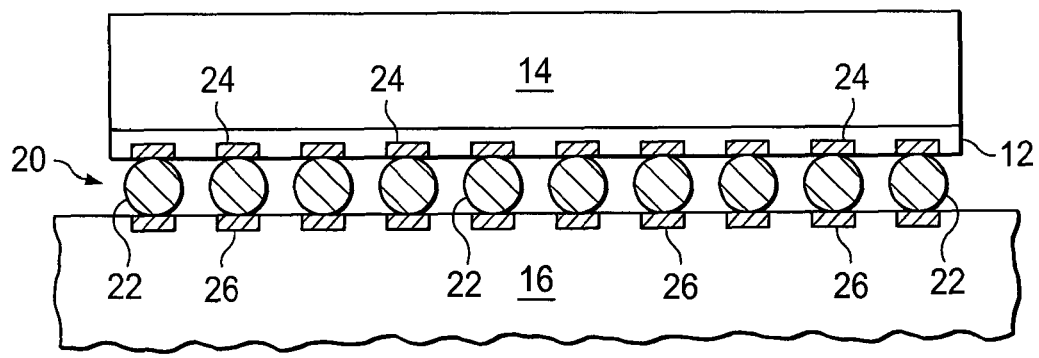

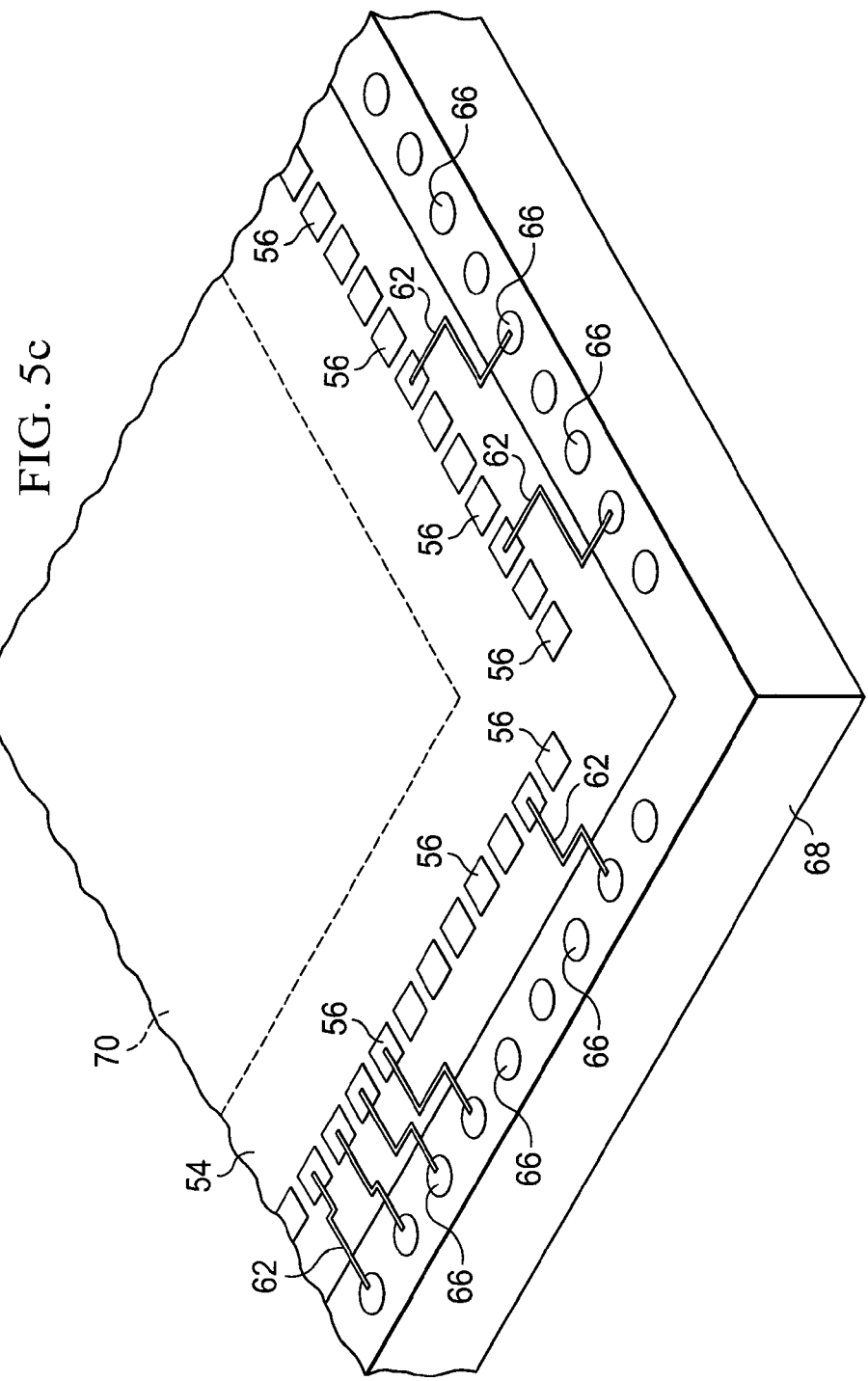

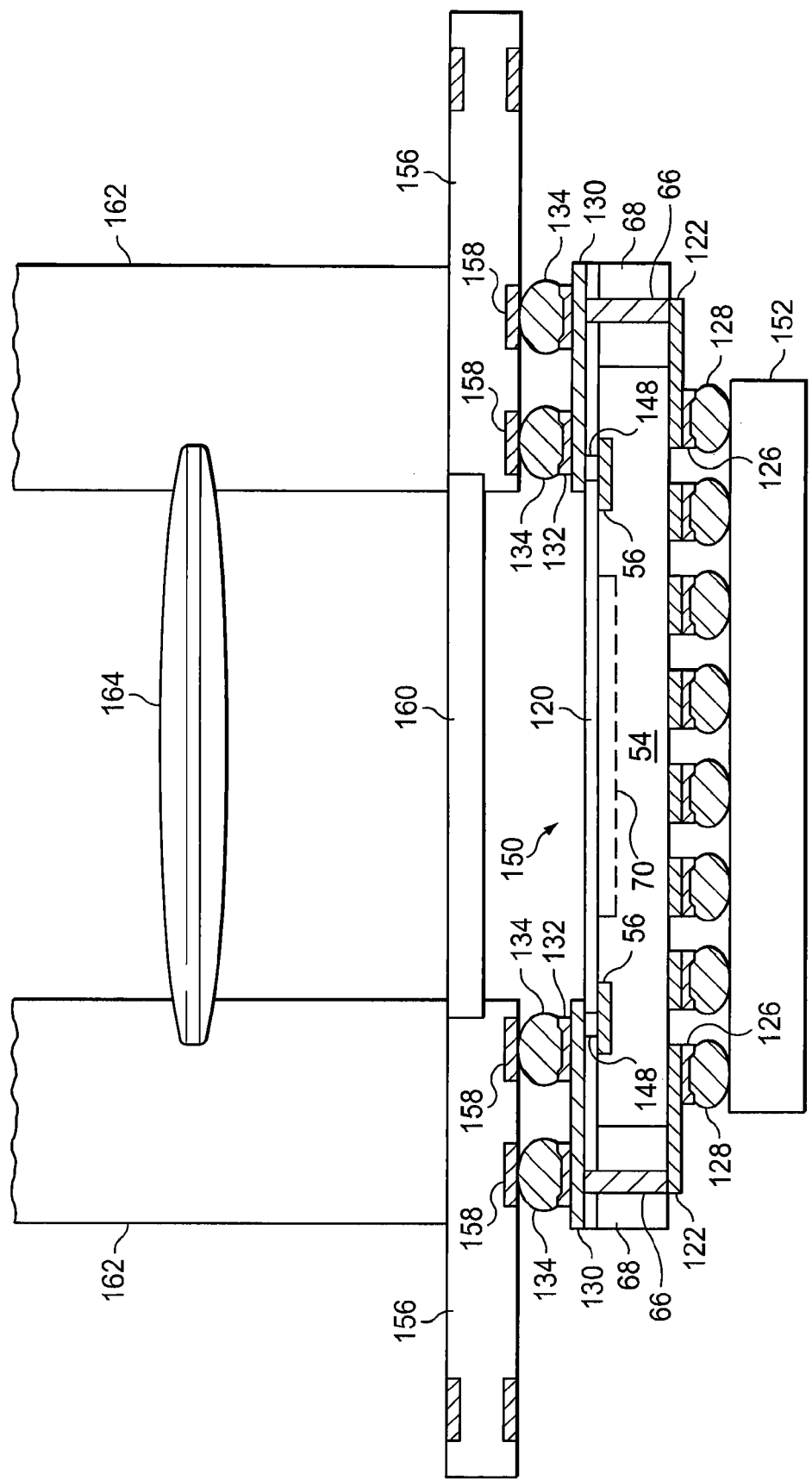

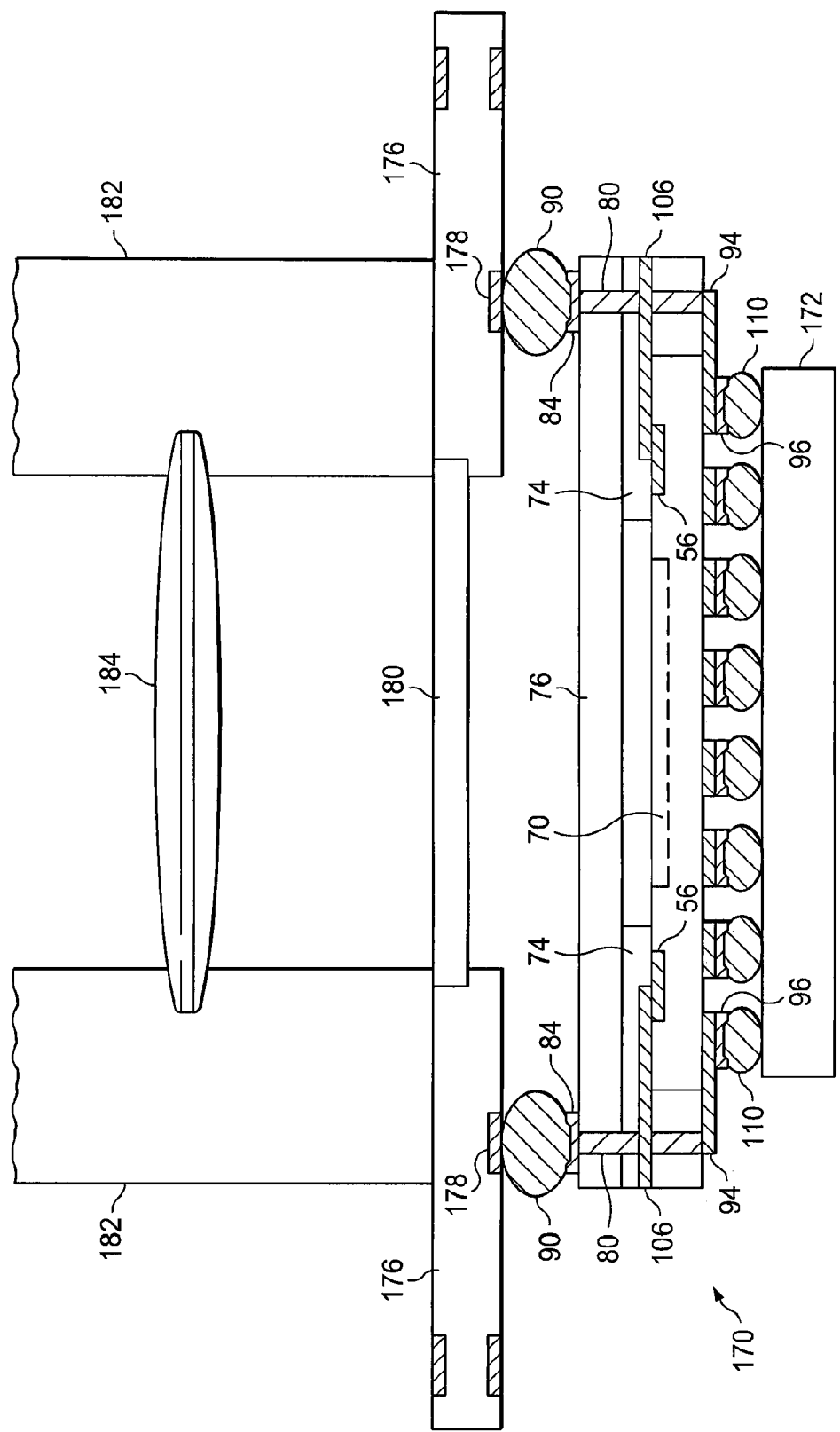

US 9,525,080 B2

SEMICONDUCTOR DEVICE WITH OPTICAL SENSOR AND METHOD OF FORMING INTERCONNECT STRUCTURE ON FRONT AND BACKSIDE OF THE DEVICE

CLAIM TO DOMESTIC PRIORITY

The present application is a continuation of U.S. patent application Ser. No. 12/941,683, now U.S. Pat. No. 8,866, 248, filed Nov. 8, 2010, which is a division of U.S. patent application Ser. No. 11/965,160, filed Dec. 27, 2007, now U.S. Pat. No. 7,851,246, which applications are incorporated herein by reference.

FIELD OF THE INVENTION

The present invention relates in general to semiconductor devices and, more particularly, to a semiconductor device with an optical sensor and method of forming an interconnect structure on the front and back sides of the device.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to stack WLCSPs. Appropriate electrical interconnect must be provided for complete device integration. The electrical interconnect has been achieved by drilling through silicon vias (TSV) in the silicon area of the die where the TSV may interfere with active circuitry.

Some semiconductor die have optical sensors in a central active area of the die. The optical sensors convert light energy to electrical signals. The electrical signals are routed through the semiconductor die to the die interconnect structure. The optical sensors impose additional space constraints on the interconnect structure as RDLs, which are typically used for interconnect rerouting, cannot pass through the glass or light-receiving side of the die. Hence, it is difficult to achieve optimal wafer level integration and interconnect for semiconductor die having optical sensors.

SUMMARY OF THE INVENTION

In one embodiment, the present invention is a method of making a semiconductor device comprising the steps of providing a substrate, providing a semiconductor die, providing an insulating layer disposed between the semiconductor die and substrate, depositing an encapsulant over the semiconductor die, forming an opening in the insulating layer using a laser, and forming a first conductive material within the opening and electrically connected to the semiconductor die. The opening extends to the semiconductor die.

In another embodiment, the present invention is a method of making a semiconductor device comprising the steps of providing a semiconductor die, providing an insulating layer, depositing an insulating material around the semiconductor die, and forming an opening in the insulating layer using a laser. The opening extends to the semiconductor die disposed over the insulating layer. The method further includes the step of forming an interconnect structure over the semiconductor die at least partially within the opening of the insulating layer.

In another embodiment, the present invention is a semiconductor device comprising a semiconductor die and insulating layer disposed over the semiconductor die with a laser-formed opening in the insulating layer extending to the semiconductor die. An insulating material is deposited around the semiconductor die. An interconnect structure is formed over the semiconductor die at least partially within the laser-formed opening in the insulating layer.

In another embodiment, the present invention is a semiconductor device comprising a semiconductor die and insulating layer disposed over the semiconductor die. An insulating material is deposited around the semiconductor die. An interconnect structure is formed over the semiconductor die at least partially within a laser-formed opening in the insulating layer.

BRIEF DESCRIPTION OF THE DRAWINGS

FIG. 1 is a flip chip semiconductor device with solder bumps providing electrical interconnect between an active area of the die and a chip carrier substrate;

FIGS. 5a-5d illustrate forming half-via and full-via THVs through die extension region electrically connected to RDLs;

FIG. 15 illustrates a semiconductor package with overhead lens assembly; and

FIG. 16 illustrates a semiconductor package with overhead lens assembly.

DETAILED DESCRIPTION OF THE DRAWINGS

Figure 2A:
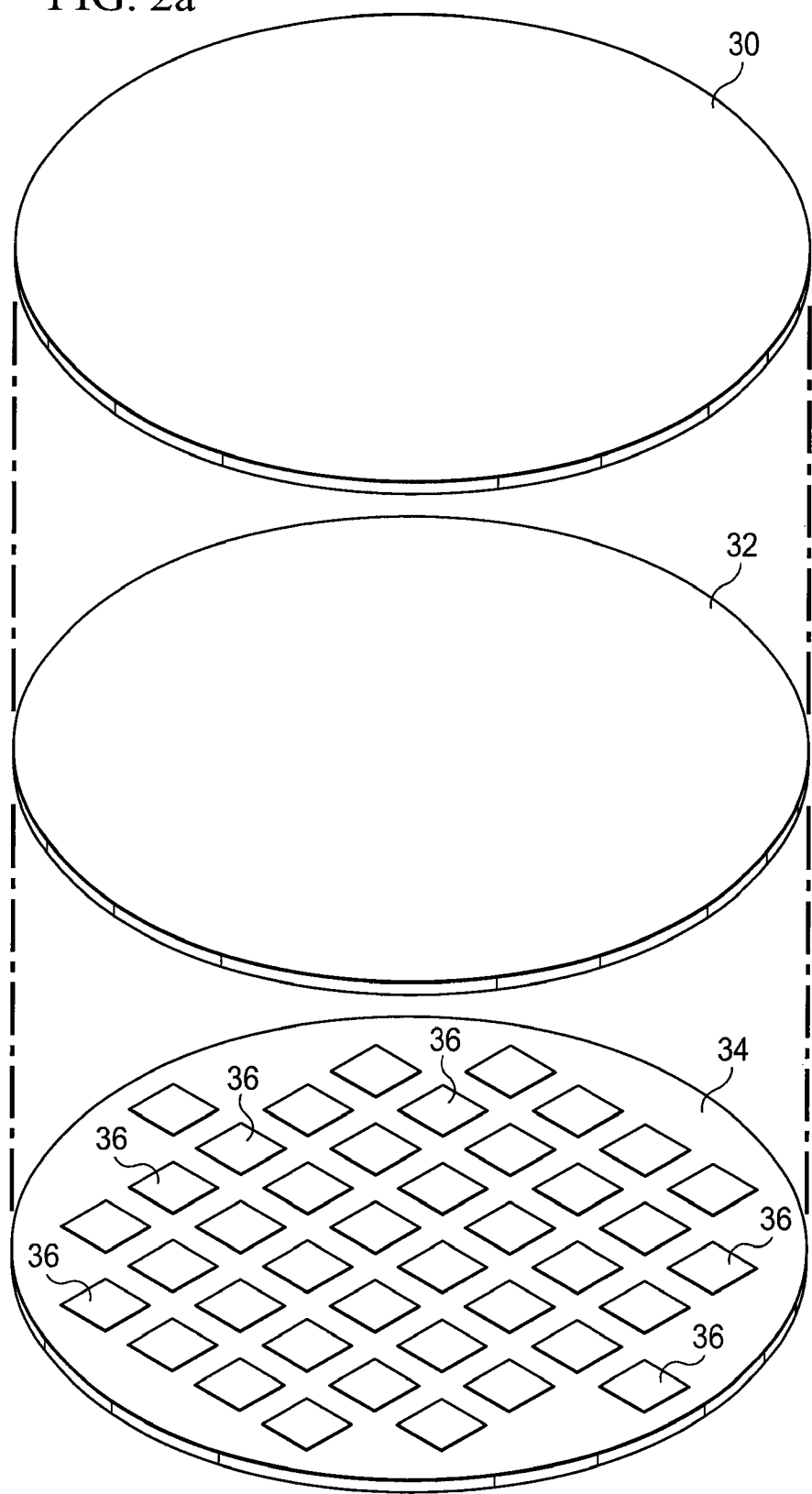
FIGS. 2a-2b illustrate glass wafer overlying clear passivation, which in turn overlies image sensor wafer.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 face down toward a chip carrier substrate or printed circuit board (PCB) 16, as shown in FIG. 1. Active area 12 contains active and passive devices, conductive layers, and dielectric layers according to the electrical design of the die. Analog circuits may be created by the combination of one or more passive device formed within active area 12 and electrically interconnected. For example, an analog circuit may include one or more inductor, capacitor and resistor formed within active area 12. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

FIG. 2a illustrates an image sensor semiconductor wafer 34 containing a plurality of semiconductor die 36. Wafer 34 can be silicon or gallium arsenide (GaAs). The semiconductor die 36 are formed on semiconductor wafer 34 using conventional integrated circuit processes, as described above. Each semiconductor die 36 contains electronic circuits and an optical sensor or optically sensitive region or optically active region to sense light and convert the light energy to electrical signals for further processing by the electronic circuitry on the die. The electric circuits are typically complementary metal oxide semiconductor (CMOS) devices and the optical devices can be charge-coupled devices (CCD). Examples of optically active semiconductor die include autofocus controller, digital-to-analog converter, digital signal processor, and image processor.

A clear passivation layer 32 is formed over wafer 34 by printing, lamination, or spin coating. A glass wafer 30 is applied to clear passivation layer 32. Glass wafer 30 is an optical grade glass with a thickness of 10-100 micrometers (μm) and low refractive index. Glass wafer 30 is typically the same shape & size as wafer 34. The clear passivation layer 32 and glass wafer 30 can be translucent or transparent to pass light to the optical sensor or optically sensitive region or optically active region of semiconductor die 36.

Figure 2B:
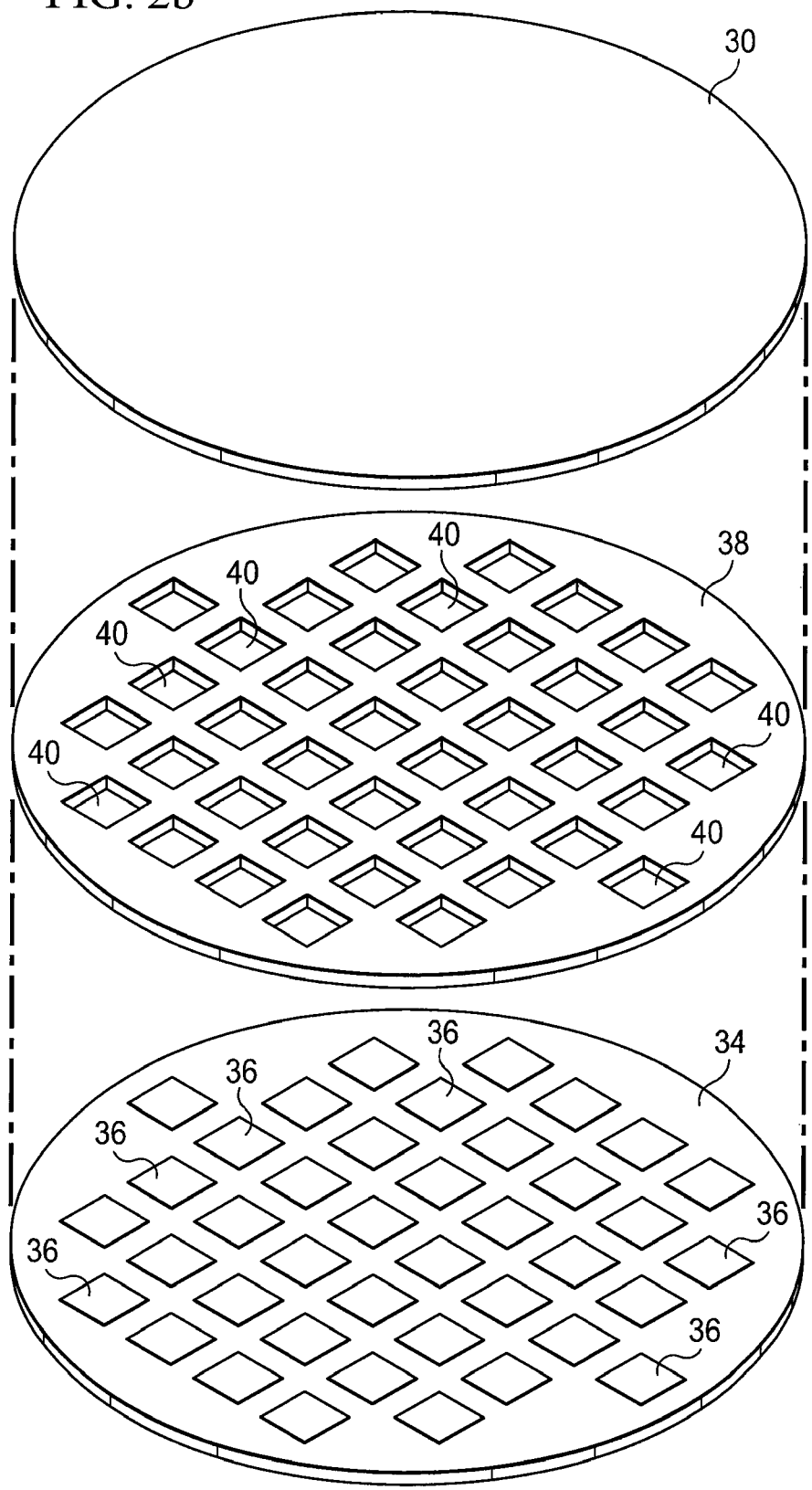

In FIG. 2b, passivation layer 38 passes light through windows 40 which are aligned over the optically active regions of semiconductor die 36. Passivation layer 38 can be formed over wafer 34 by printing or lamination. Glass wafer 30 is applied to passivation layer 38. Windows 40 and glass wafer 30 can be translucent or transparent to pass light to the optical sensor or optically sensitive region or optically active region of semiconductor die 36.

Figure 3A:
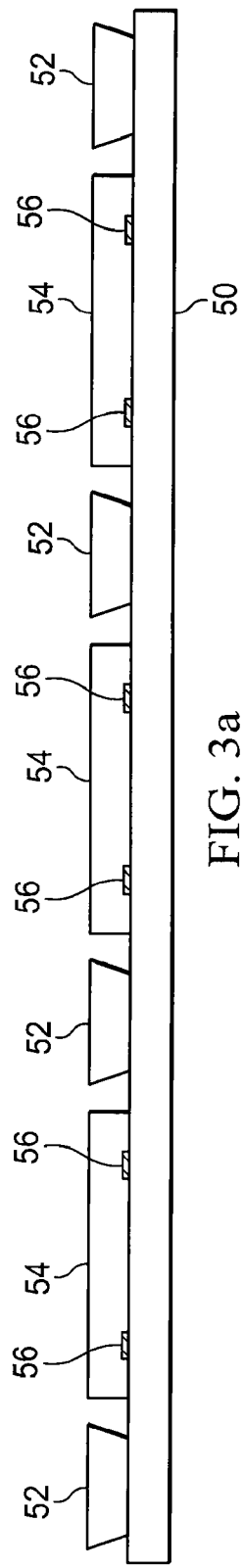
FIGS. 3a-3c illustrate forming an extension region around periphery of semiconductor die.
Figure 3B:
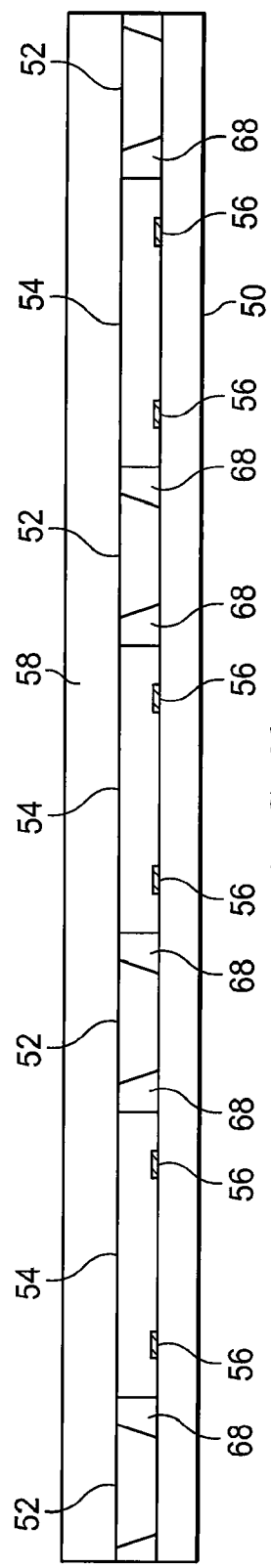
Figure 3C:
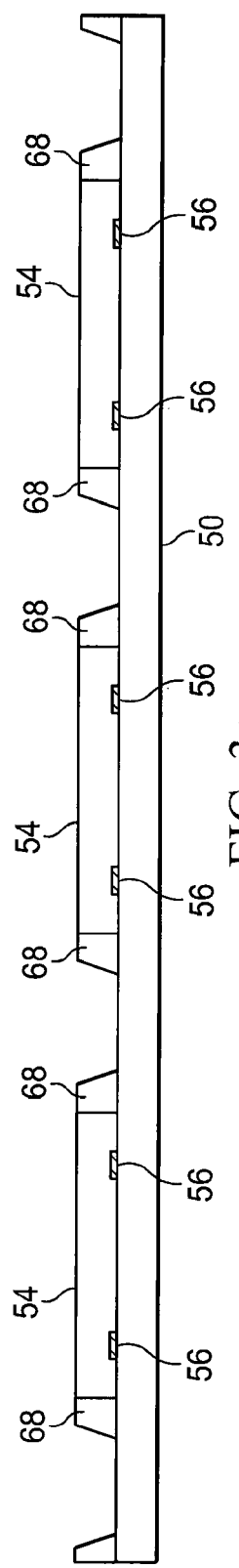

FIGS. 3a-3c illustrate a process of forming non-conductive passivation or polymer die extension regions around a periphery of semiconductor die 54 for a wafer level chip scale package (WLCSP). The semiconductor wafer as described above is diced to separate the semiconductor die into individual units. The semiconductor die are transferred onto a temporary chip carrier. FIG. 3a shows mold cavity clamps 52 affixed to coverlay tape 50. Semiconductor die 54 are transferred from the wafer and affixed to tape 50 with its active surface and contact pads 56 oriented face down onto the tape between mold cavity clamps 52. Semiconductor die 54 can also be mounted to coverlay tape 50 using post wafer saw tape transfer.

In FIG. 3b, a top mold clamp closure 58 is applied over mold cavity clamps 52 creating an enclosure or cavity around a periphery of semiconductor die 54. The cavity is filled with a polymer molding compound down to coverlay tape 50. The polymer molding compound forms a non-conductive die extension region 68 around a periphery of semiconductor die 54. The filling process can be performed by transfer molding or injection molding. Alternatively, a soft laminating film having sufficient softness, volume, and thickness can be used to encapsulate the die. Also, liquid epoxy molding and compression molding could be used to form the die extension region. The mold clamp enclosure 52 and 58 are removed in FIG. 3c. The coverlay tape is peeled away to expose the contact pads and active front side of semiconductor die 54.

Figure 4A:
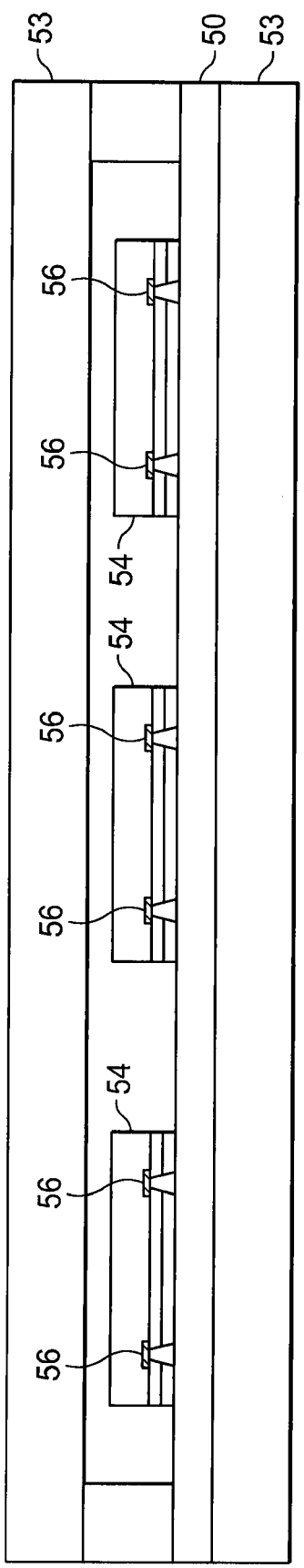
FIGS. 4a-4d illustrate an alternate formation of the extension region around periphery of semiconductor die.
Figure 4B:
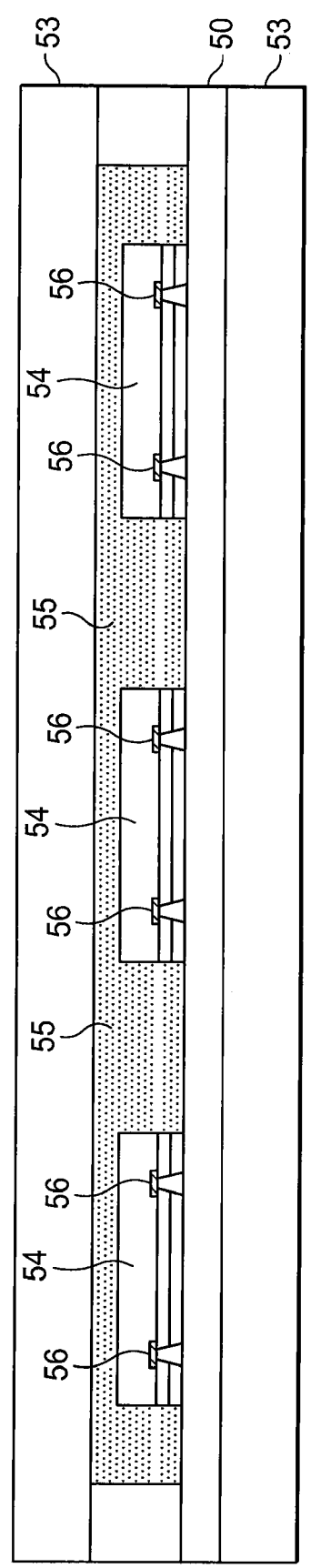
Figure 4C:
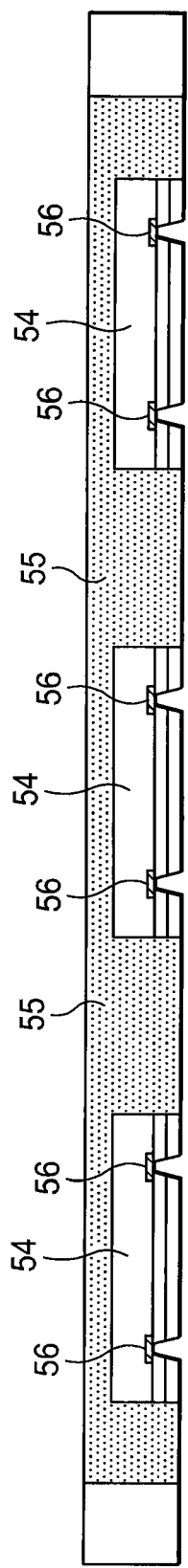
Figure 4D:
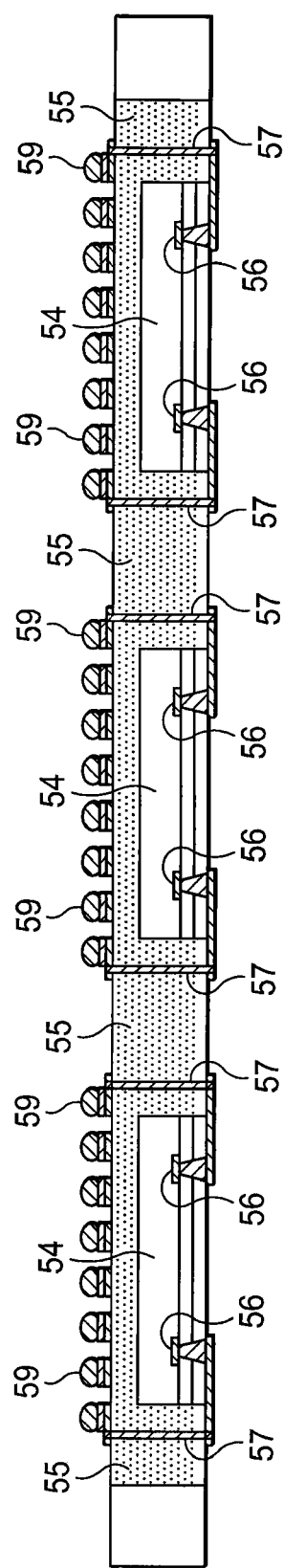

FIGS. 4a-4d illustrate an alternate formation of the extension region around periphery of semiconductor die. In FIG. 4a, semiconductor die 54 with passivation and glass layers are mounted to overlay tape 50. Semiconductor die 54 are enclosed by mold clamps 53. In FIG. 4b, the enclosures formed by mold clamps 53 are filled with molding compound 55. The molding compound 55 surrounds semiconductor die 54 to form die extension regions around a periphery of the die. Mold clamps 53 are removed in FIG. 4c. An interconnect structure is formed on semiconductor die 54. THVs 57 are formed through the die extension region. RDLs are formed on the front and back sides of the die. UBMs and solder bumps 59 are also formed in electrical contact with the RDLs and THVs.

Figure 5A:
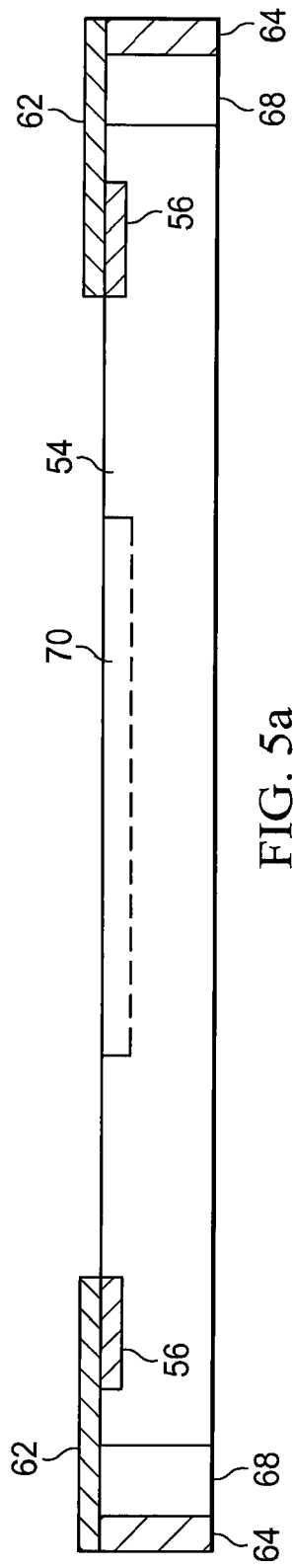

In FIG. 5a, semiconductor die 54 are inverted such that the contact pads and active front side of the die face upward. A plurality of through hole vias (THV) 64 is formed in die extension region 68 between semiconductor die 54 by etching or laser drilling. An electrically conductive material is deposited in THVs 64 using an evaporation, electrolytic plating, electroless plating, or screen printing process. The conductive material can be aluminum (Al), copper (Cu), tin (Sn), nickel (Ni), gold (Au), or silver (Ag). FIG. 5a shows half-via THVs 64 formed in an edge of extension region 68. A redistribution layer (RDL) 62 is formed between THVs 64 and contact pads 56 of semiconductor die 54. RDLs 62 can be made with Al, aluminum copper alloy (AlCu), Cu, or Cu alloy. RDLs 62 operate as an intermediate conduction layer to route electrical signals between THVs 64 and contact pads 56. Optically active region 70 is disposed in an interior area of semiconductor die 54.

Figure 5B:
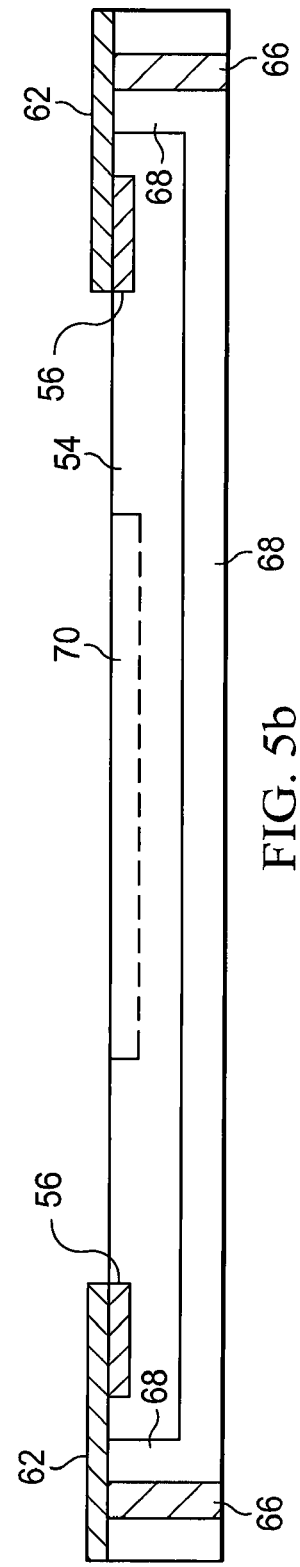

In FIG. 5b, THVs 66 are formed in die extension region 68 between semiconductor die 54 by etching or laser drilling. In this case, THVs 66 are full vias formed in an interior area of extension region 68, i.e., THVs 66 are completely surrounded by the extension region. The polymer molding compound of extension region 68 also covers a backside of semiconductor die 54, opposite the active surface of the die. As described in FIG. 5a, an electrically conductive material is deposited in THVs 66 using an evaporation, electrolytic plating, electroless plating, or screen printing process. The conductive material can be Al, Cu, Sn, Ni, Au, or Ag. RDLs 62 is formed between THVs 66 and contact pads 56 of semiconductor die 54. RDLs 62 operate as an intermediate conduction layer to route electrical signals between THVs 66 and contact pads 56. Optically active region 70 is disposed in an interior area of semiconductor die 54.

FIG. 5c illustrates a perspective view of semiconductor die 54. THVs 66 are full-vias formed in an interior area of die extension region 68. Extension region 68 completely surrounds THVs 66. RDLs 62 electrically connect contact pads 56 to THVs 66. Depending on the electrical interconnect of the active circuits, some of the contact pads 56 are electrically isolated from adjacent THVs 66, i.e., no connecting RDL is formed. Optically active region 70 is disposed in an interior area of semiconductor die 54.

Figure 5D:
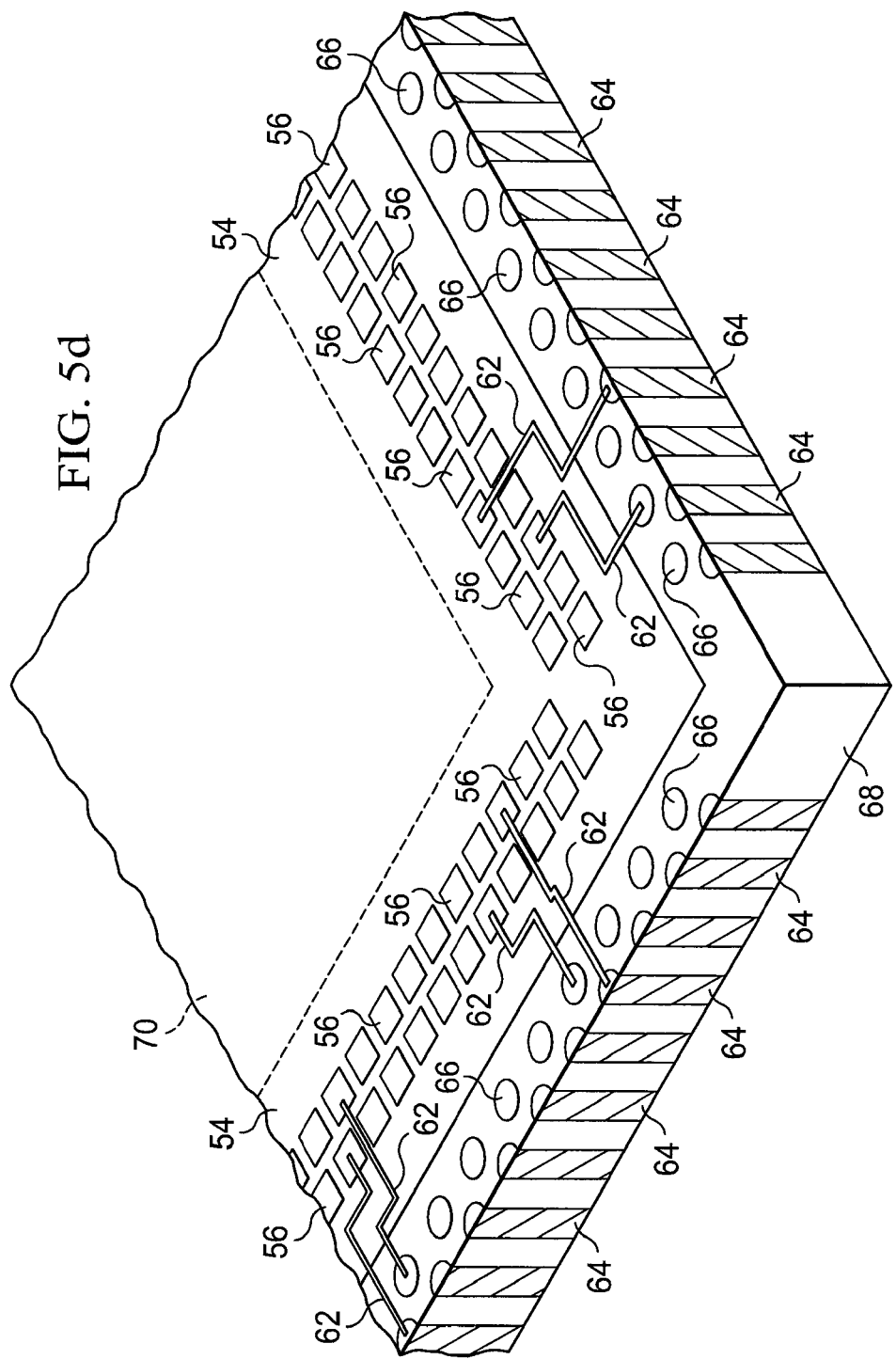

FIG. 5d illustrates another perspective view of semiconductor die 54. In this case, half-via THVs 64 and full-via THVs 66 are formed in die extension region 68. Extension region 68 completely surrounds THVs 66. RDLs 62 electrically connect contact pads 56 to THVs 64 and 66. Depending on the electrical interconnect of the active circuits, some of the contact pads 56 are electrically isolated from adjacent THVs 64 and 66, i.e., no connecting RDL is formed. Optically active region 70 is disposed in an interior area of semiconductor die 54.

Figure 6:
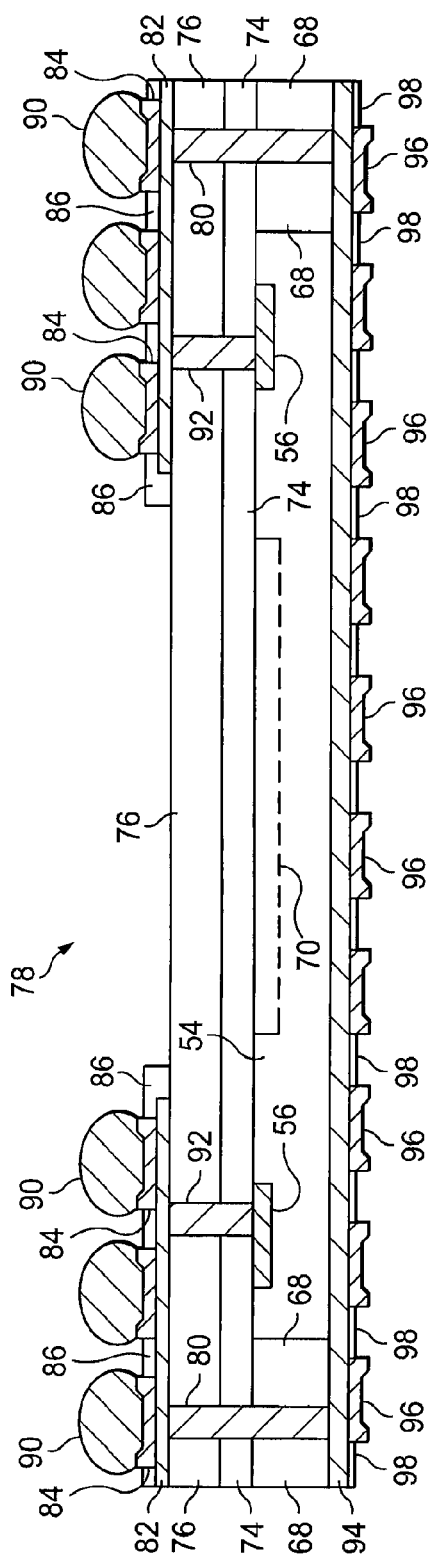
FIG. 6 illustrates a semiconductor package with THVs formed through die extension region, clear passivation layer, and glass layer and electrically connected to RDLs.

Turning to FIG. 6, clear passivation layer 74 is shown on the active surface of semiconductor die 54. Glass layer 76 is shown applied to clear passivation 74. Glass layer 76 may be grounded for static discharge and reduce dust accumulation on its surface. THVs 80 are formed through die extension region 68, passivation layer 74, and glass layer 76 by laser drilling. RDLs 82 are formed on glass layer 76. THVs 80 electrically connect RDLs 82 with RDLs 94 on the backside of semiconductor package 78. RDLs 82 and 94 can be made with Al, AlCu, Cu, or Cu alloy. RDLs 82 and 94 operate as intermediate conduction layers to route electrical signals as needed for the electrical function of semiconductor die 54. RDLs 82 also electrically connect through THVs 92 to contact pads 56. THVs 92 are formed through passivation layer 74 and glass layer 76 by laser drilling.

An under bump metallization (UBM) 84 is deposited and patterned to electrically contact RDLs 82. In one embodiment, UBMs 84 may include a wetting layer, barrier layer, and adhesive layer. A passivation layer 86 is formed over RDLs 82 and between UBMs 84 for structural support and electrical isolation. Passivation layer 86 can be made with silicon dioxide (SiO2), silicon oxynitride (SiON), silicon nitride (SixNy), polyimide (PI), benzocyclobutene (BCB), polybenzoxazole (PBO), or other insulating material.

An electrically conductive solder material is deposited over UBMs 84 through an evaporation, electrolytic plating, electroless plating, ball drop, or screen printing process. The solder material can be any metal or electrically conductive material, e.g., Sn, lead (Pb), Ni, Au, Ag, Cu, bismuthinite (Bi) and alloys thereof. In one embodiment, the solder material is 63 percent weight of Sn and 37 percent weight of Pb. The solder material is reflowed by heating the conductive material above its melting point to form spherical balls or bumps 90. In some applications, solder bumps 90 are reflowed a second time to improve electrical contact to UBMs 84. UBMs 86 and solder bumps 90 represent one type of interconnect structure.

On the backside of semiconductor die 54, UBM 96 is deposited and patterned to electrically contact RDLs 94. In one embodiment, UBMs 96 may include a wetting layer, barrier layer, and adhesive layer. A passivation layer 98 is formed over RDLs 94 for structural support and electrical isolation. Passivation layer 98 can be made with SiO2, SiON, SixNy, PI, BCB, PBO, or other insulating material.

Light passes through glass layer 76 and clear passivation 74 to optical sensor or optically active region 70, which converts the light energy to electrical signals for further processing by electronic circuits within semiconductor die 54. The electrical signals can be routed through contact pads 56 to THVs 80 and 92 and RDLs 82 and 94 to UBMs 84 and 96 and solder bumps 90. The interconnect structure provides complete signal routing to front and back sides of optical semiconductor package 78.

Figure 7:
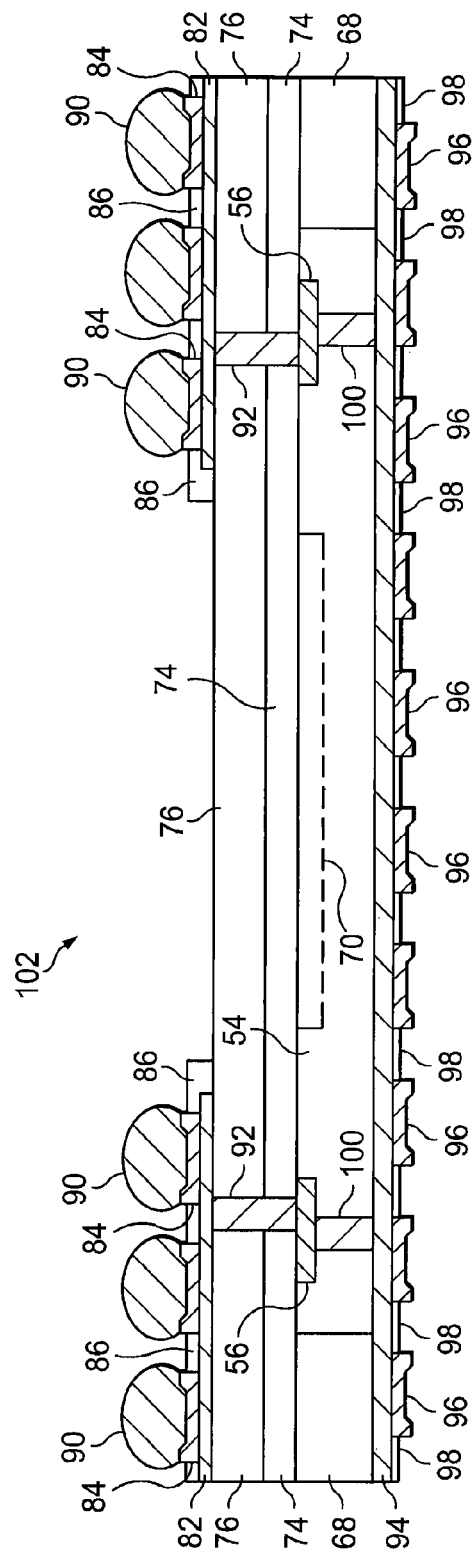
FIG. 7 illustrates another semiconductor package with THVs formed through die extension region, clear passivation layer, and glass layer and electrically connected to RDLs.

In FIG. 7, clear passivation layer 74 is shown on the active surface of semiconductor die 54. Glass layer 76 is shown applied to clear passivation 74. THVs 92 are formed through passivation layer 74 and glass layer 76 by laser drilling. RDLs 82 are formed on glass layer 76. THVs 92 electrically connect contact pads 56 with RDLs 82. UBMs 84 are deposited and patterned to electrically contact RDLs 82. Passivation layer 86 is formed over RDLs 82 for structural support and electrical isolation. An electrically conductive solder material is deposited over UBMs 84 through an evaporation, electrolytic plating, electroless plating, ball drop, or screen printing process. The solder material is reflowed by heating the conductive material above its melting point to form spherical balls or bumps 90.

Contact pads 56 also electrically connect to RDLs 94 on the backside of semiconductor package 102 by way of through silicon vias (TSV) 100. In this embodiment, no THV is formed in die extension region 68. Instead, TSVs 100 are formed through an active region of semiconductor die 54 by etching or laser drilling. UBMs 96 are deposited and patterned to electrically contact RDLs 94. Passivation layer 98 is formed over RDLs 94 for structural support and electrical isolation.

Light passes through glass layer 76 and clear passivation 74 to optically active region 70, which converts the light energy to electrical signals for further processing by electronic circuits within semiconductor die 54. The electrical signals can be routed through contact pads 56 to THVs 92 and TSVs 100 and RDLs 82 and 94 to UBMs 84 and 96 and solder bumps 90. The interconnect structure provides complete signal routing to front and back sides of optical semiconductor package 102.

Figure 8:
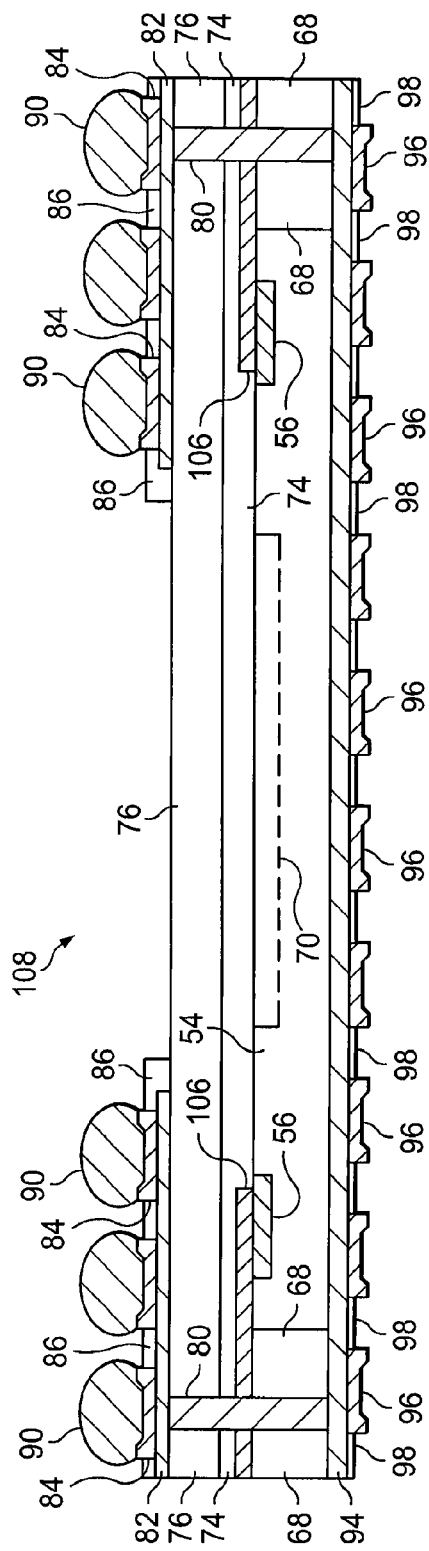
FIG. 8 illustrates another semiconductor package with THVs formed through die extension region, clear passivation layer, and glass layer and electrically connected to RDLs.

In FIG. 8, clear passivation layer 74 is shown on the active surface of semiconductor die 54. Glass layer 76 is shown applied to clear passivation 74. THVs 80 are formed through die extension region 68, passivation layer 74, and glass layer 76 by laser drilling. RDLs 82 are formed on glass layer 76. RDLs 106 electrically connect contact pads 56 with THVs 80, which in turn electrically connect RDLs 82 and 94. UBMs 84 are deposited and patterned to electrically contact RDLs 82. Passivation layer 86 is formed over RDLs 82 for structural support and electrical isolation. An electrically conductive solder material is deposited over UBMs 84 through an evaporation, electrolytic plating, electroless plating, ball drop, or screen printing process. The solder material is reflowed by heating the conductive material above its melting point to form spherical balls or bumps 90. UBMs 96 are deposited and patterned to electrically contact RDLs 94. Passivation layer 98 is formed over RDLs 94 for structural support and electrical isolation.

Light passes through glass layer 76 and clear passivation 74 to optically active region 70, which converts the light energy to electrical signals for further processing by electronic circuits within semiconductor die 54. The electrical signals can be routed through contact pads 56 to RDLs 106 and THVs 80 to RDLs 82 and 94 and finally to UBMs 84 and 96 and solder bumps 90. The interconnect structure provides complete signal routing to front and back sides of optical semiconductor package 108.

Figure 9:
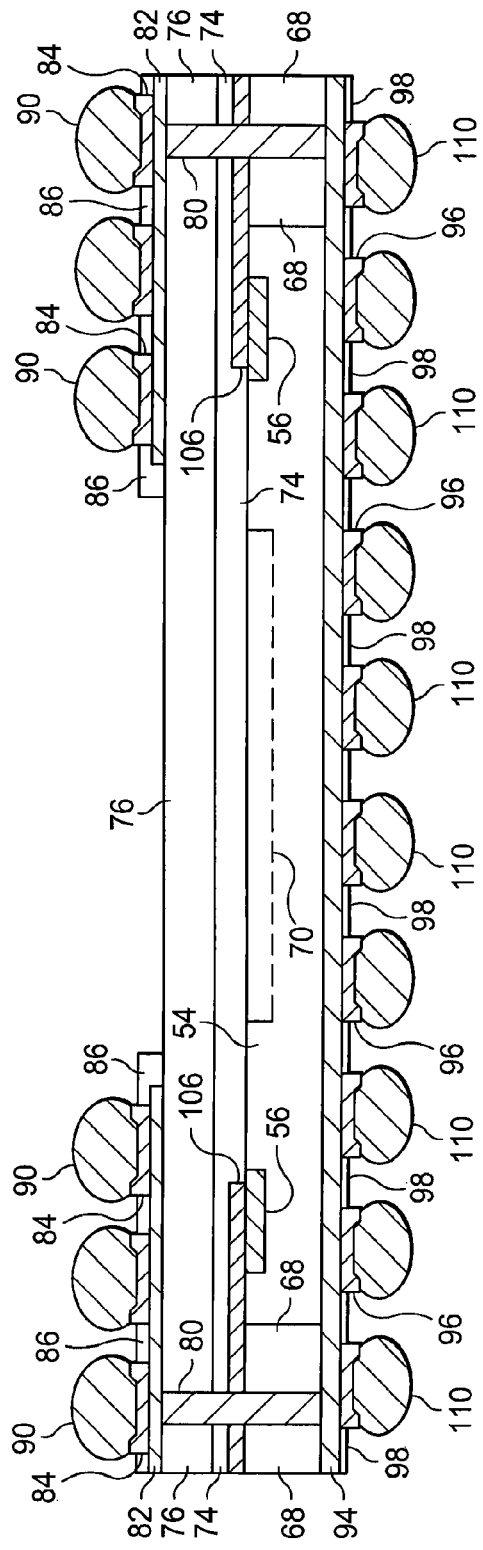
FIG. 9 illustrates a semiconductor package with THVs formed through die extension region and electrically connected to RDLs and solder bumps.

FIG. 9 is similar to FIGS. 6-8 with optional solder bumps 110 formed on UBMs 96. An electrically conductive solder material is deposited over UBMs 96 through an evaporation, electrolytic plating, electroless plating, ball drop, or screen printing process. The solder material is reflowed by heating the conductive material above its melting point to form spherical balls or bumps 110.

Figure 10:
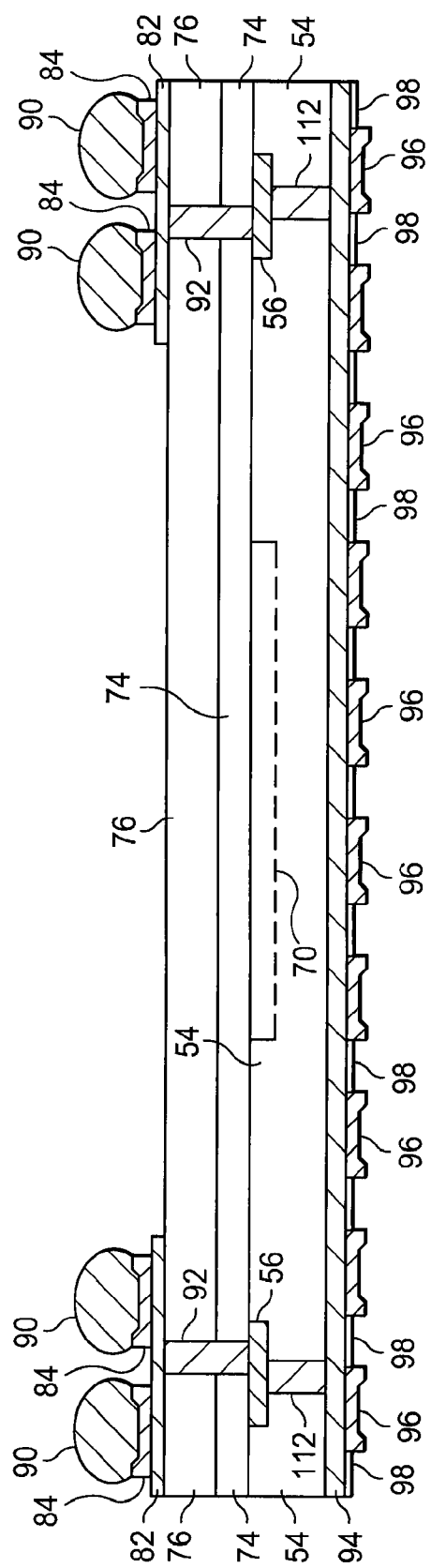
FIG. 10 illustrates a semiconductor package with TSVs and THVs formed through semiconductor die, clear passivation layer, and glass layer and electrically connected to RDLs.

FIG. 10 shows THVs 92 electrically connecting contact pads 56 to RDLs 82 and TSVs 112 electrically connecting contact pads 56 to RDLs 94. Other components have similar functions as described above.

Figure 11:
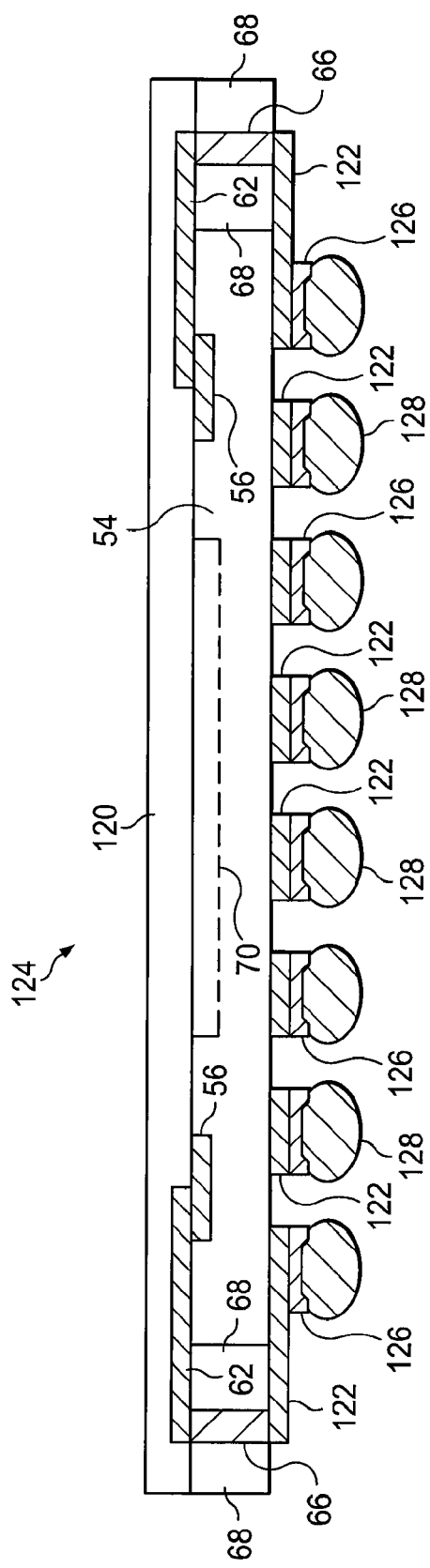
FIG. 11 illustrates a semiconductor package with THVs formed through die extension region and electrically connected to RDLs.

In FIG. 11, clear passivation layer 120 is shown on the active surface of semiconductor die 54. THVs 66 are formed through die extension region 68. RDLs 62 electrically connect contact pads 56 with THVs 66, which in turn electrically connect to RDLs 122 on the backside of semiconductor package 124. UBMs 126 are deposited and patterned on RDLs 122. An electrically conductive solder material is deposited over UBMs 126 through an evaporation, electrolytic plating, electroless plating, ball drop, or screen printing process. The solder material is reflowed by heating the conductive material above its melting point to form spherical balls or bumps 128.

Light passes through clear passivation 120 to optically active region 70, which converts the light energy to electrical signals for further processing by electronic circuits within semiconductor die 54. The electrical signals can be routed through contact pads 56 to RDLs 62 and THVs 66 to RDLs 122 and UBMs 126 and finally to solder bumps 128. The interconnect structure provides complete signal routing to optical front and back sides of semiconductor package 124.

Figure 12:
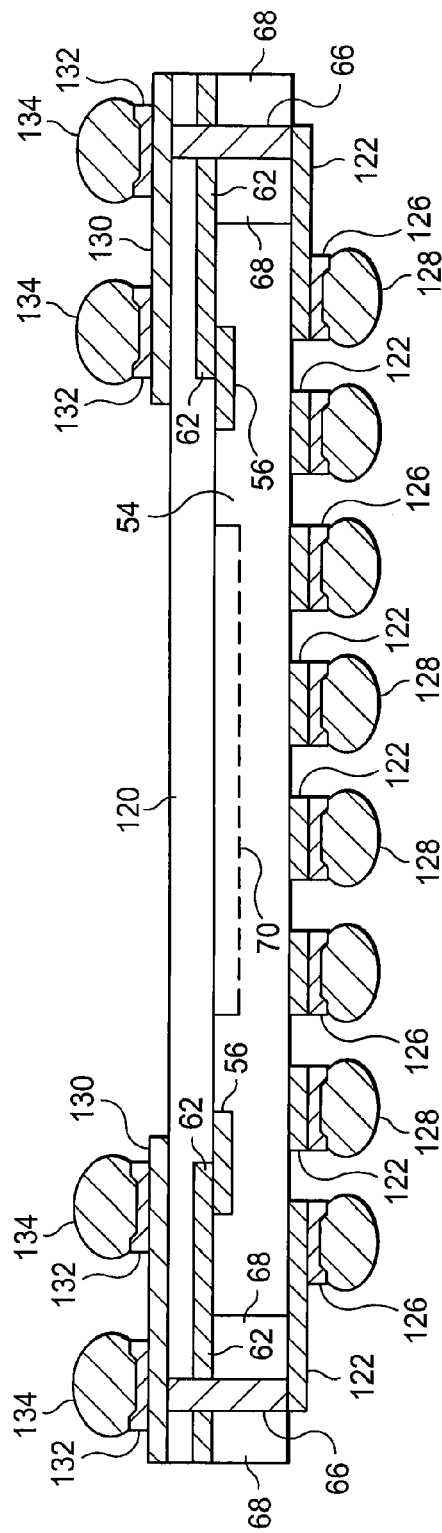
FIG. 12 illustrates a semiconductor package with THVs formed through die extension region and clear passivation layer and electrically connected to RDLs.

FIG. 12 is similar to FIGS. 6-11 and additionally has THVs 66 extending through clear passivation 120 to RDLs 130. UBMs 132 are formed on RDLs 130. Solder bump 134 are formed on UBMs 132.

Figure 13:
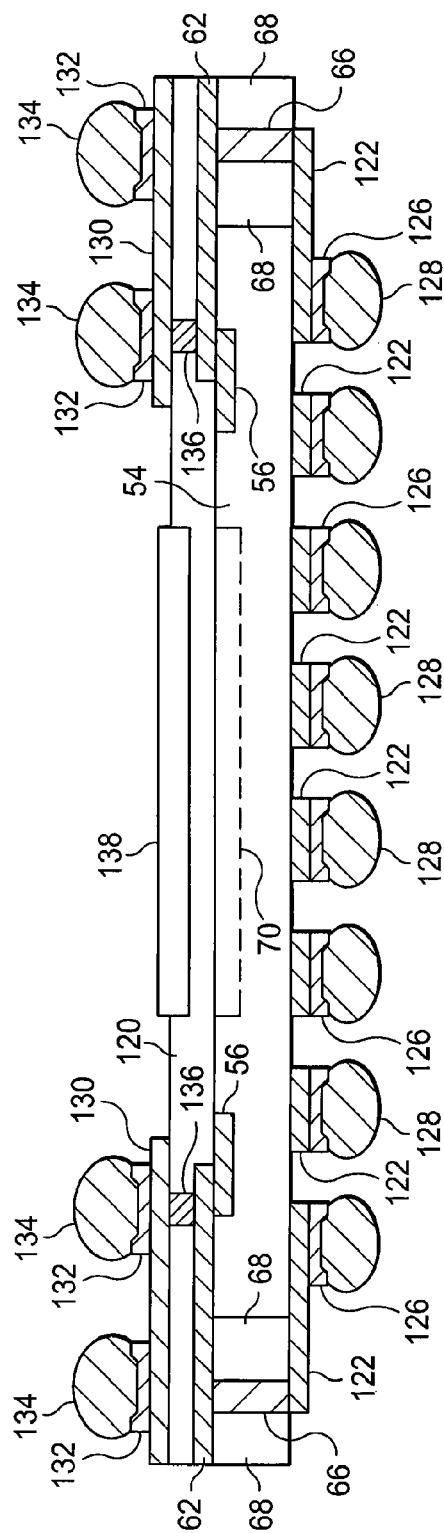
FIG. 13 illustrates another semiconductor package with THVs formed through die extension region and clear passivation layer and electrically connected to RDLs.

FIG. 13 is similar to FIGS. 6-12 and additionally has THVs 136 formed through clear passivation 120 and electrically connect RDLs 62 and RDLs 130. Glass die 138 is formed on clear passivation 120. Glass die 138 is the final surface-defining element of the image sensor to rectify distortion or undesired refraction of light passing into the sensor. In some cases, the clear passivation may have limitations in surface flatness that may cause certain distortions. The addition of a glass die provides the necessary flatness as defined by the glass. The glass offers some correction in refraction. The glass can have an ultra violet (UV) filter.

Figure 14:
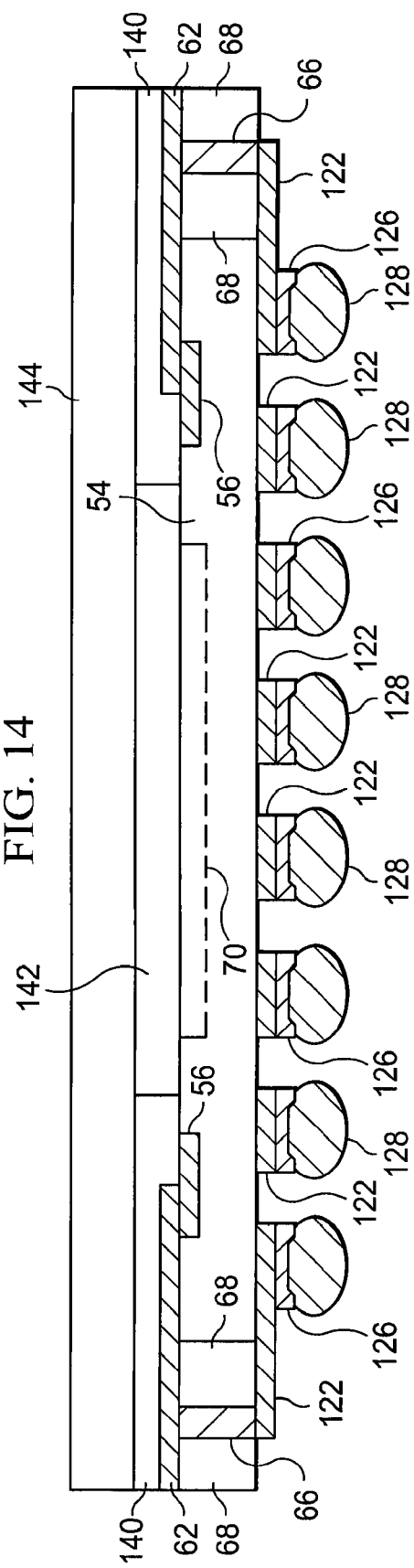
FIG. 14 illustrates a semiconductor package with THVs formed through die extension region and electrically connected to RDLs, with an area devoid of passivation between clear passivation layers and glass layer overlay.

FIG. 14 is similar to FIGS. 6-13 and additionally has clear passivation layer 140 with window 142 formed on semiconductor die 54. Window 142 is devoid of passivation and allows for passage of light. Glass layer 144 is formed over clear passivation layer 140.

Light passes through glass layer 144 and window 142 to optically active region 70, which converts the light energy to electrical signals for further processing by electronic circuits within semiconductor die 54. The electrical signals can be routed through contact pads 56 to RDLs 62 and THVs 66 to RDLs 122 and UBMs 126 and finally to solder bumps 128. The interconnect structure provides complete signal routing to optical front and back sides of the semiconductor package.

FIGS. 15 and 16 illustrate the semiconductor package used in various image sensor applications. The semiconductor package provides relatively low cost method of packaging image sensor dies. The package supports miniaturization. The package construction is robust, highly reliable and resistant to moisture-related damage.

FIG. 15 shows an application of semiconductor package 150 including semiconductor die 54 with optically active region 70, similar to FIGS. 6-14. THVs 148 electrically connect contact pads 56 and RDLs 130. Semiconductor package 150 is mounted and electrically connected to PCB or chip carrier substrate 152 with solder bumps 128 as a ball grid array (BGA), flip chip, or WLSCP. Semiconductor package 150 is further mounted and electrically connected to substrate 156 with solder bumps 134 contacting contact pads 158. Protective glass 160 is supported by substrate 156 and overlies clear passivation 120 and optically active region 70. Lens assembly 162 supports lens 164, which focuses light through protective glass 160 and clear passivation 120 to optically active region 70. The light energy is converted to electrical signals for further processing by electronic circuits within semiconductor die 54. The electrical signals can be routed through contact pads 56 to RDLs 130 and 122 and THVs 66 to UBMs 132 and 126 and finally to solder bumps 128 and 134. The interconnect structure provides complete signal routing to front and back sides of optical semiconductor package 150.

FIG. 16 shows an application of semiconductor package 170 including semiconductor die 54 with optically active region 70, similar to FIGS. 6-14. Semiconductor package 170 is mounted and electrically connected to PCB or chip carrier substrate 172 with solder bumps 110 as a ball grid array (BGA), flip chip, or WLSCP. Semiconductor package 170 is further mounted and electrically connected to substrate 176 with solder bumps 90 contacting contact pads 178. Protective glass 180 is supported by substrate 176 and overlies glass layer 76 and optically active region 70. Lens assembly 182 supports lens 184, which focuses light through protective glass 180 and glass layer 76 to optically active region 70. The light energy is converted to electrical signals for further processing by electronic circuits within semiconductor die 54. The electrical signals can be routed through contact pads 56 to RDLs 106 and 94 and THVs 80 to UBMs 84 and 96 and finally to solder bumps 90 and 110. The interconnect structure provides complete signal routing to front and back sides of optical semiconductor package 170.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   providing an insulating layer in contact with an active surface of the semiconductor die;
   disposing a substrate over the semiconductor die and insulating layer;
   depositing an encapsulant to surround the semiconductor die;
   removing the substrate after depositing the encapsulant;
   forming an opening in the insulating layer extending to the semiconductor die using a laser; and
   forming a first conductive material within the opening and electrically connected to the semiconductor die.

2. The method of claim 1, further including:
   forming a via through the encapsulant using the laser; and
   forming a second conductive material within the via.

3. The method of claim 1, further including forming a conductive layer over the insulating layer and electrically connected to the semiconductor die.

4. The method of claim 1, further including forming an interconnect structure over the semiconductor die and encapsulant.

5. The method of claim 4, wherein forming the interconnect structure includes forming a plurality of bumps.

6. The method of claim 1, wherein the active surface of the semiconductor die includes an optically active region.

7. A method of making a semiconductor device, comprising:
   providing a wafer;
   singulating a semiconductor die from the wafer;
   disposing the semiconductor die over a temporary carrier;
   forming an insulating layer on an active surface of the semiconductor die;
   depositing an insulating material around the semiconductor die after singulating the semiconductor die from the wafer;
   removing the temporary carrier;
   forming an opening in the insulating layer extending to a contact pad of the semiconductor die using a laser; and
   forming an interconnect structure over the semiconductor die at least partially within the opening of the insulating layer after removing the temporary carrier.

8. The method of claim 7, further including:
   forming a via through the insulating material using the laser; and
   forming a second conductive material within the via.

9. The method of claim 7, further including:
   forming a via through the semiconductor die using the laser; and
   forming a second conductive material within the via.

10. The method of claim 7, wherein forming the interconnect structure includes forming a conductive layer over the insulating layer and electrically connected to the semiconductor die.

11. The method of claim 7, wherein forming the interconnect structure includes forming a plurality of bumps.

12. The method of claim 7, wherein the active surface of the semiconductor die includes an optically active region.

13. The method of claim 7, wherein the insulating layer includes a clear material.

14. The method of claim 7, wherein depositing the insulating material over the semiconductor die further includes depositing the insulating material across a back surface of the semiconductor die continuously from a first side of the semiconductor die to a second side of the semiconductor die opposite the first side.

15. A method of making a semiconductor device, comprising:
   providing a semiconductor die;
   disposing the semiconductor die over a carrier;
   forming an insulating layer over an active surface of the semiconductor die;
   depositing an insulating material continuously across a back surface of the semiconductor die;
   removing the carrier;
   forming an opening in the insulating layer extending to the semiconductor die using a laser; and
   forming an interconnect structure over the semiconductor die after removing the carrier.

16. The method of claim 15, further including:
forming a via through the insulating material using the laser; and
forming a second conductive material within the via.

17. The method of claim 15, wherein forming the interconnect structure includes forming a conductive layer over the insulating layer and electrically connected to the semiconductor die.

18. The method of claim 15, further including:
forming a via through the semiconductor die using the laser; and
forming a second conductive material within the via.

19. The method of claim 15, wherein providing the semiconductor die further includes:
providing a wafer including a plurality of semiconductor die; and
singulating the semiconductor die from the wafer.

20. The method of claim 19, wherein depositing the insulating material around the semiconductor die further includes depositing the insulating material around the semiconductor die after singulating the semiconductor die from the wafer.

21. A method of making a semiconductor device, comprising:
providing a semiconductor die;
forming an insulating layer over the semiconductor die;
depositing an encapsulant continuously across a back surface of the semiconductor die;
forming an opening through the insulating layer extending to a contact pad of the semiconductor die using a laser; and
forming an interconnect structure over the semiconductor die and into the opening of the insulating layer.

22. The method of claim 21, further including:
forming a via through the encapsulant using the laser; and
forming a second conductive material within the via.

23. The method of claim 21, wherein forming the interconnect structure includes forming a conductive layer over the insulating layer and electrically connected to the semiconductor die.

24. The method of claim 21, wherein forming the interconnect structure includes forming a plurality of bumps.

25. The method of claim 21, wherein the semiconductor die includes an optically active region.

\* \* \* \* \*